(12) United States Patent
Song

(10) Patent No.: US 8,203,083 B2
(45) Date of Patent: Jun. 19, 2012

(54) ELECTROMAGNETIC WAVE SHIELDING HEAT-RADIATION SHEET AND MANUFACTURED METHOD THEREOF

(75) Inventor: Jin-Ho Song, Goyang-si (KR)

(73) Assignee: Nano Interface Technology, Siheung-si (KR)

( * ) Notice: Subject to any disclaimer, the term of this patent is extended or adjusted under 35 U.S.C. 154(b) by 269 days.

(21) Appl. No.: 12/596,368

(22) PCT Filed: Apr. 17, 2008

(86) PCT No.: PCT/KR2008/002164
§ 371 (c)(1),
(2), (4) Date: Mar. 24, 2010

(87) PCT Pub. No.: WO2008/127077
PCT Pub. Date: Oct. 23, 2008

(65) Prior Publication Data
US 2010/0224399 A1    Sep. 9, 2010

(30) Foreign Application Priority Data

Apr. 17, 2007  (KR) .................. 10-2007-0037270
Nov. 2, 2007   (KR) .................. 10-2007-0111802

(51) Int. Cl.
*H05K 9/00*   (2006.01)
(52) U.S. Cl. ................. 174/354; 277/640; 277/630
(58) Field of Classification Search .......... 174/354, 174/355; 277/640, 630
See application file for complete search history.

(56) References Cited

U.S. PATENT DOCUMENTS

| | | | | |
|---|---|---|---|---|
| 4,822,060 A * | 4/1989 | Moyer et al. | .................. | 277/640 |
| 5,712,449 A * | 1/1998 | Miska et al. | .................. | 174/356 |
| 6,140,577 A * | 10/2000 | Rapaich et al. | .............. | 174/365 |
| 6,201,182 B1* | 3/2001 | Sosnowski | ..................... | 174/369 |
| 6,283,770 B1* | 9/2001 | Leung et al. | .................... | 439/92 |
| 6,320,122 B1* | 11/2001 | Dickey et al. | ................. | 174/359 |
| 6,359,214 B1* | 3/2002 | Worley et al. | ................. | 174/366 |
| 6,525,267 B1* | 2/2003 | Worley et al. | ................. | 174/370 |
| 6,744,641 B2* | 6/2004 | Schnabel | ...................... | 361/818 |
| 7,129,421 B2* | 10/2006 | Reis et al. | ..................... | 174/354 |
| 7,442,880 B2* | 10/2008 | Nasstrom et al. | ............ | 174/354 |
| 2004/0035599 A1* | 2/2004 | Dispenza et al. | ........ | 174/35 GC |

FOREIGN PATENT DOCUMENTS

| | | |
|---|---|---|
| JP | 2003-051691 A | 2/2003 |
| JP | 2005-340746 A | 12/2005 |
| KR | 10-2003-0069247 A | 8/2003 |
| KR | 10-2004-0020271 A | 3/2004 |
| KR | 10-2006-0000012 A | 1/2006 |
| KR | 10-2006-0041854 A | 5/2006 |

* cited by examiner

*Primary Examiner* — Hung Ngo
(74) *Attorney, Agent, or Firm* — Sughrue Mion, PLLC

(57) ABSTRACT

Disclosed is an electromagnetic wave shielding heat-radiation sheet allowing electricity and heat to be transferred from one side surface to the other side surface of the sheet, in which conductive protrusions formed by partially cutting a conductive layer laminated on an elastic support layer are bent toward the rear surface of the elastic support layer to pass through the elastic support layer and come in contact with the rear surface of the elastic support layer.

19 Claims, 4 Drawing Sheets ies*

ELECTROMAGNETIC WAVE SHIELDING HEAT-RADIATION SHEET AND MANUFACTURED METHOD THEREOF

CROSS REFERENCE TO RELATED APPLICATIONS

This application is a National Stage of International Application No. PCT/KR2008/002164 filed Apr. 17, 2008, claiming priority based on Korean Patent Application Nos. 10-2007-0037270 filed Apr. 17, 2007 and 10-2007-0111802 filed Nov. 2, 2007, the contents of all of which are incorporated herein by reference in their entirety.

1. Technical Field

The present invention relates to an electromagnetic wave shielding heat-radiation sheet and a method of manufacturing the same.

2. Background Art

In general, from electronic products such as a computer, a portable personal terminal, a communication device, electromagnetic waves harmful to the human body are emitted. Such an electromagnetic wave causes problems in an electronic product, such as malfunction, performance degradation, noise, image deterioration, lifetime reduction, quality deterioration, etc., as well as being harmful to the human body. In order to shield an electromagnetic wave causing such problems, various electromagnetic wave shielding/absorbing system have been recently developed.

For example, there are electromagnetic wave shielding system made by elastic thermoplastic resin such as polyethylene, polypropylene, polyvinyl chloride, EPDM, butadiene, or styrene-butadiene, etc. are used as an elastomer core, and then electrically conductive fabrics or non-woven fabrics are laminated surrounding the core, the fabrics or the non-woven fabrics being electrically plated or conductive coated with a metal such as gold, silver, copper, nickel, etc. (see FIG. 8). Such an electromagnetic wave shielding systems are generally large and too thick due to a core polymer with conductive fabrics, and having difficulties applying to an electronic communication device, etc. that shows a tendency to be smaller and thinner day by days. Also, there are problems of complicated manufacturing process and a high material cost.

Also, there is an electromagnetic wave shielding system which is made by directly compounding conventionally known electrically conductive metallic powder such as conductive carbon black, graphite, gold, silver, copper, nickel, aluminum, etc. into a formulation of a polymer elastomer so as to provide volume conductivity to the polymer elastomer. In other words, the electromagnetic wave shielding system may be obtained by uniformly dispersing electric conductive filler, that is, conventionally known minute conductive powder such as carbon black, graphite, gold, silver, copper, nickel, aluminum, etc. into the inside of a polymer elastomer. However, the electric conductive filler compounded in the polymer elastomer can create electrically conductivity within the polymer elastomer so that electric conductive particles contact each other build a pathway to have continuity within the polymer elastomer is formed. When metal particles or carbon black particles are in very close contact with each other within a polymer elastomer, a pathway formed by the contact between such particles plays a role as a conductor allowing electrons to be transferred, thereby allowing electric connection between the top and bottom surfaces of an electromagnetic wave shielding system. However, too much metal particles or carbon black particles are present within a polymer elastomer to obtain higher conductivity, the metals and carbon black particles are difficult to disperse uniformly and the melt visco-elasticity of the resin compounds may be reduced. Accordingly, there has been a problem in that foaming becomes impossible, and the absorbing property for impact and vibration is reduced due to specific-gravity increase and physical property deterioration of a product.

Meanwhile, an electronic product emits a large amount of heat, in addition to an electromagnetic wave. Such excessive heat energy shortens the lifetime of a product, causes a defect or malfunction, or in the worst case, provides a cause of explosion or fire. Especially, in the case of a plasma display panel (PDP), an LCD monitor, etc., for which the demand has been recently increased, heat energy generated from the inside of a system decreases the sharpness, the resolution, etc., and thus decreases the reliability of a product as well as the stability of a product.

In order to solve the problems, an electronic product requires a heat radiating system for radiating heat emitted from the inside of a system to the outside. The above described electromagnetic wave shielding system can shield or absorb an electromagnetic wave emitted from an electronic product, but cannot radiate the emitted heat to the outside. Also, even when the electromagnetic wave shielding system can radiate the heat to the outside, such an effect has not been significant. Therefore, in addition to an electromagnetic wave shielding/absorbing system, a heat-radiating system has been conventionally mounted as an addition in an electronic product.

For example, as a conventional heat-radiating system, a method of mounting a heat sink has been employed. However, when the heat sink is solely used, heat emitted from a heating element of an electronic product cannot be efficiently radiated to the outside. In addition, since there is a gap between the heating element and the heat sink, it is impossible to efficiently radiate the heat with heat sink only to the outside. Also, the heat sink cannot reduce or remove the occurrence of noise, vibration, etc.

Accordingly, between a heating element and a heat sink in an electronic device, a heat conductive adhesive has been conventionally generally intervened. In the heat conductive adhesive, an adhesive polymer resin, such as an acrylic resin, a silicon resin, or a polyurethane resin, is mixed with heat-conductive filler such as alumina, boron nitride, aluminum nitride, gold, silver, copper, aluminum, nickel, zinc, etc. Such a heat conductive adhesive is usually used as a seat type or a grease type. However, the heat conductive adhesive has a limitation in transferring heat at continuous emission of heat, or at instantaneous emission of a large amount of heat, and thus the amount of transferred heat may be saturated, thereby increasing the temperature of the adhesive or the electronic product. Also, when a large amount of heat-conductive filler is added in order to increase heat conductivity, the strength of the adhesive itself is lowered. Also, it is not easy to handle and apply such a heat conductive adhesive. In addition, most heat conductive adhesives are effective in radiating heat emitted from the inside of an electronic device to the outside, but cannot shield/absorb an electromagnetic wave.

Besides, as a heat-radiating system, a metal material of high heat conductivity, such as gold, silver, copper, aluminum, nickel, etc. has been conventionally used. However, when such a metal material is solely used, flexibility and fillability is insufficient. Therefore, even when the material is applied to an electronic device, the close adhesion property with the electronic device is insufficient.

As described above, in general, each of an electromagnetic wave shielding/absorbing system and a heat-radiating system has been conventionally independently applied to an electronic product. However, when both the electromagnetic wave shielding/absorbing system and the heat-radiating system are used, the entire thickness or volume of a product is increased, and thus it has not been easy to apply such system to an electronic product having a tendency to be light and slim.

DISCLOSURE OF THE INVENTION

Therefore, the inventors of the present invention have tried to obtain a sheet capable of radiating heat emitted from the inside of a system to the outside and shielding or absorbing an electromagnetic wave.

In result, the inventors found that in cutting a laminated sheet in which a conductive layer is laminated on a surface of an elastic support layer having multiple perforated portions therein, conductive protrusions are formed by partially cutting the conductive layer, while being bent toward the rear surface of the elastic support layer to pass through the elastic support layer via the perforated portions of the elastic support layer, and protruding from the rear surface of the elastic support layer to come in contact with the rear surface of the elastic support layer, thereby allowing electricity and heat to be efficiently transferred from one side surface to the other side surface of the sheet.

The present invention is based on the above described facts.

According to an aspect of the present invention, there is provided an electromagnetic wave shielding heat-radiation sheet including: an elastic support layer; and at least one conductive layer laminated on one surface or both surfaces of the elastic support layer, wherein, in the elastic support layer, multiple perforated portions are formed at a predetermined interval; in the conductive layer, conductive protrusions are formed by partially cutting the conductive layer, which are coaxial to the perforated portions; and the conductive protrusions are bent toward a rear surface of the elastic support layer to pass through the elastic support layer via the perforated portions, and protrude from the rear surface of the elastic support layer to come in contact with the rear surface of the elastic support layer.

According to another aspect of the present invention, there is provided an electromagnetic wave shielding heat-radiation sheet including: an elastic support layer; and at least one conductive layer laminated on one surface or both surfaces of the elastic support layer, wherein, in the elastic support layer, multiple elastic protrusions are formed by partially cutting the elastic support layer at a predetermined interval; the elastic protrusions are bent toward a rear surface of the elastic support layer to come in contact with the rear surface of the elastic support layer; in the conductive layer, conductive protrusions are formed by partially cutting the conductive layer, which are coaxial to the elastic protrusions; and the conductive protrusions are bent, together with the elastic protrusions, toward the rear surface of the elastic support layer to pass through the elastic support layer, and protrude from the rear surface of the elastic support layer to come in contact with the rear surface of the elastic support layer.

According to a further aspect of the present invention, there is provided a method of manufacturing an electromagnetic wave shielding heat-radiation sheet, the method including the steps of: (a) forming each of an elastic support layer and a conductive layer; (b) forming perforated portions in the elastic support layer by using a first punching machine; (c) laminating the conductive layer on at least one surface of the elastic support layer having the perforated portions formed therein; and (d) forming conductive protrusions in the conductive layer by partially cutting, at a predetermined interval, the conductive layer coaxial to the perforated portions by using a second punching machine, wherein, in step (d), the conductive protrusions are formed by cutting, while being bent toward a rear surface of the elastic support layer by a cutting force to pass through the elastic support layer via the perforated portions, and protruding from the rear surface of the elastic support layer to come in contact with the rear surface of the elastic support layer.

According to a still further aspect of the present invention, there is provided a method of manufacturing an electromagnetic wave shielding heat-radiation sheet, the method including the steps of: (i) forming each of an elastic support layer and a conductive layer; (ii) laminating the conductive layer on at least one surface of the elastic support layer; and (iii) forming conductive protrusions in the conductive layer, and at the same time forming elastic protrusions in the elastic support layer by partially cutting both the elastic support layer and the conductive layer at a predetermined interval by using a punching machine, wherein, in step (iii), the conductive protrusions are formed by cutting while being bent, together with the elastic protrusions, toward a rear surface of the elastic support layer by a cutting force to pass through the elastic support layer, and protruding from the rear surface of the elastic support layer to come in contact with the rear surface of the elastic support layer.

BRIEF DESCRIPTION OF THE INDICATION

1: elastic support layer,
11: perforated portion,

11': elastic protrusion,

2: conductive layer,

21: conductive protrusion, d: radius of the perforated, vertical length of the elastic protrusion, and vertical length of the conductive protrusion.

BEST MODE FOR CARRYING OUT THE INVENTION

Reference will now be made in detail to the exemplary embodiments of the present invention.

Figure 1:
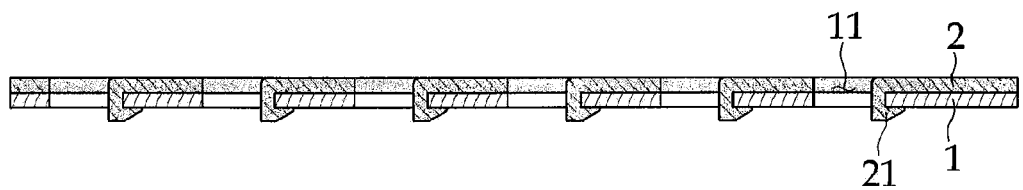
FIG. 1 is a cross-sectional view of an electromagnetic wave shielding heat-radiation sheet according to an embodiment of the present invention.
Figure 2:
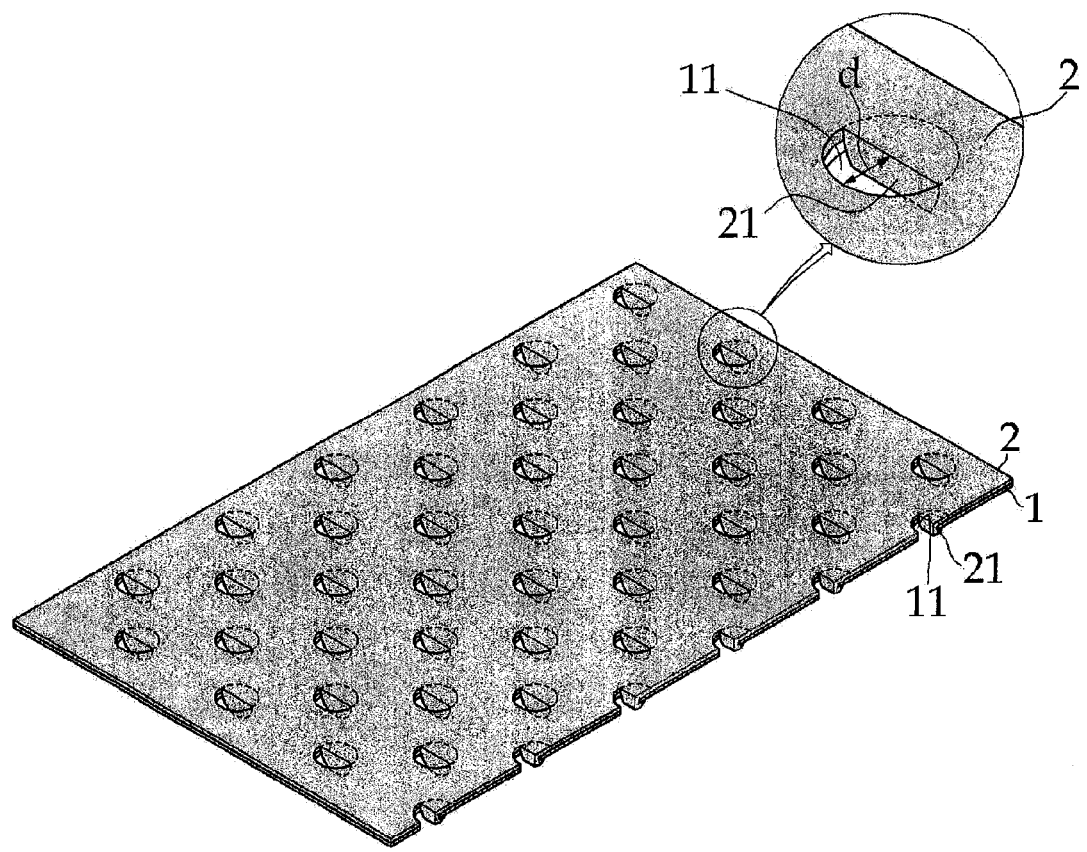
FIG. 2 is a perspective view of an electromagnetic wave shielding heat-radiation sheet according to an embodiment of the present invention, in which an enlarged view illustrates a conductive protrusion formed by partially cutting a conductive layer, the conductive protrusion being bent toward the rear surface of an elastic support layer to pass through the elastic support layer, and coming in contact with the rear surface of the elastic support layer.

In the present invention, perforated portions 11 indicate cut portions of an elastic support layer 1, which are formed by cutting the elastic support layer at a predetermined interval by using a punching machine before a conductive layer 2 is laminated to the elastic support layer 1 (see FIGS. 1 and 2).

In the present invention, elastic protrusions 11' indicate portions of an elastic support layer 1, which are formed by partially cutting the elastic support layer when a laminated sheet of the elastic support layer 1 and a conductive layer 2 is cut by a punching machine. Specifically, each of the elastic protrusions 11', that is, a portion of the elastic support layer, includes a cut portion and a portion that is not cut, and is connected to the elastic support layer. Herein, the connected portion is bent toward the rear surface of the elastic support layer, and thus the cut portion passes through the elastic support layer, and protrudes from the rear surface of the elastic support layer to come in contact with the rear surface of the elastic support layer (see FIGS. 3 and 4).

Also, in the present invention, conductive protrusions indicate portions of the conductive layer 2, which are formed by partially cutting the conductive layer 2 by a punching machine. Specifically, each of the conductive protrusions 21, that is, a portion of the conductive layer, includes a cut portion and a portion that is not cut, and is connected to the conductive layer. Herein, the connected portion is bent toward the rear surface of the elastic support layer, and thus the cut portion passes through the elastic support layer, and protrudes from the rear surface of the elastic support layer to come in contact with the rear surface of the elastic support layer. In other words, the conductive protrusions 21 may be bent toward the rear surface of the elastic support layer to pass through the elastic support layer via the perforated portions 11, and protrude from the rear surface of the elastic support layer to come in contact with the rear surface of the elastic support layer. Otherwise, the conductive protrusions 21, together with the elastic protrusions 11', may be bent toward the rear surface of the elastic support layer to pass through the elastic support layer, and protrude from the elastic support layer to come in contact with the rear surface of the elastic support layer (see FIGS. 1 to 4).

The present invention provides an electromagnetic wave shielding heat-radiation sheet including an elastic support layer 1; and a conductive layer 2 laminated on at least one surface of the elastic support layer, in which conductive protrusions 21 formed by partially cutting the conductive layer are bent toward the rear surface of the elastic support layer to pass through the elastic support layer, and protrude from the rear surface of the elastic support layer to come in contact with the rear surface of the elastic support layer. Herein, the conductive protrusions 21 allow the electromagnetic wave shielding heat-radiation sheet of the present invention to transfer electricity and heat from one side surface to the other side surface.

Conventionally, an electromagnetic wave shielding/absorbing system for excluding the interference of an electromagnetic wave emitted from an electronic device has been used to protect the electronic device from the electromagnetic wave, and also a heat radiating system for radiating heat emitted from the inside of an electronic device to the outside has been additionally used to protect the electronic device from heat. In other words, each of an electromagnetic wave shielding/absorbing system and a heat radiating system has been independently used.

Figure 8:
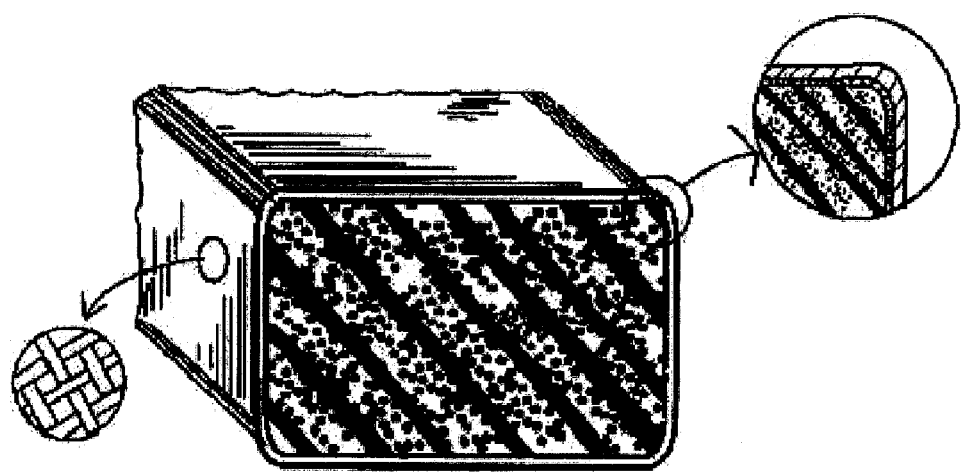
FIG. 8 illustrates a conventional electromagnetic wave shielding system.

For example, as a conventional electromagnetic wave shielding/absorbing system, an electromagnetic wave shielding gasket as shown in FIG. 8 has been employed. Such a conventional electromagnetic wave shielding gasket includes a polymer elastomer, of which an outer circumferential surface is surrounded by a conductive fiber cloth, etc., or a polymer elastomer filled with conductive filler. However, in the case of the polymer elastomer, of which an outer circumferential surface is surrounded by a fiber cloth, etc., the thickness becomes too thick to be applied to an electronic device having a tendency to be slim. Also, in the case of the polymer elastomer filled with conductive filler, a large amount of conductive filler is required to be added in the polymer elastomer so that conductive filler particles can be in contact with each other and thus can form a continuous pathway allowing electrons to be transferred, but there has been a problem in that a large amount of conductive filler deteriorates physical properties of the polymer elastomer, thereby reducing the absorbing property for impact and vibration. In addition, such a conventional electromagnetic wave shielding/absorbing system can protect an electronic device from an electromagnetic wave, but cannot radiate heat emitted within the electronic device to the outside, and thus cannot be used for protecting the electronic device from heat.

Therefore, conventionally, in addition to the electromagnetic wave shielding/absorbing system, a heat radiating system for radiating heat emitted from the inside of a system to the outside has been additionally mounted in an electronic device.

As an example of the heat radiating system, there is a heat conductive adhesive intervened between a heating element and a heat sink of an electronic device. The heat conductive adhesive includes heat-conductive filler, etc., such as aluminum oxide, within an adhesive polymer resin. Such a heat conductive adhesive is effective in radiating heat due to the high speed at which heat is transferred to the heat sink. However, the heat conductive adhesive has a limitation in transferring heat at continuous emission of heat, or at instantaneous emission of a large amount of heat, and thus the amount of transferred heat may be saturated, thereby increasing the temperature of the adhesive or the electronic product. Also, most heat conductive adhesives are effective in radiating heat emitted from the inside of an electronic device to the outside, but cannot shield/absorb an electromagnetic wave. Also, when a large amount of heat-conductive filler is added in order to increase the heat conductivity, the strength of the adhesive is lowered. Also, it is not easy to handle and apply such a heat conductive adhesive. In addition, most heat conductive adhesives are effective in radiating heat emitted from the inside of an electronic device to the outside, but cannot shield/absorb an electromagnetic wave.

As described above, each of a heat-radiating system and an electromagnetic wave shielding/absorbing system has been conventionally independently used for an electronic device to protect the electronic device from heat and an electromagnetic wave. Accordingly, the entire volume of a product is increased, and thus it has been difficult to apply such system to an electronic device having a tendency to be light and slim.

Therefore, in the present invention, it is possible to transfer electricity and heat from one side surface to the other side surface of a sheet, since conductive protrusions 21 are bent toward the rear surface of an elastic support layer 1 to pass through the elastic support layer, and come in contact with the rear surface of the elastic support layer, the conductive protrusions 21 being formed by partially cutting a conductive layer 2 laminated on at least one surface of the elastic support layer 1. Accordingly, the electromagnetic wave shielding heat-radiation sheet according to the present invention can radiate heat emitted from the inside of a system to the outside, and at the same time can effectively shield or absorb an electromagnetic wave, unlike a conventional heat radiating system or electromagnetic wave shielding/absorbing system.

Specifically, an electromagnetic wave shielding heat-radiation sheet according to an embodiment of the present invention includes: an elastic support layer 1 having multiple perforated portions 11 formed at a predetermined interval; and a conductive layer 2 laminated on at least one surface of the elastic support layer, in which, in the conductive layer, conductive protrusions 21 are formed (see FIGS. 1 and 2), the conductive protrusions 21 being formed by partially cutting the conductive layer coaxial to the perforated portions. Herein, the conductive protrusions 21 are bent toward the rear surface of the elastic support layer by a cutting force, and the bent conductive protrusions pass through the elastic support layer via the perforated portions 11, and protrude from the rear surface of the elastic support layer to come in contact with the rear surface of the elastic support layer.

Also, an electromagnetic wave shielding heat-radiation sheet according to another embodiment of the present invention includes: an elastic support layer 1; and a conductive layer 2 laminated on at least one surface of the elastic support layer, in which in the elastic support layer 1 and the conductive layer 2, elastic protrusions 11' and conductive protrusions 21 are formed (see FIGS. 3 and 4), the elastic protrusions 11' and the conductive protrusions 21 being formed by partially cutting both the elastic support layer and the conductive layer. Herein, both the elastic protrusions 11' and the conductive protrusions 21 are bent toward the rear surface of the elastic support layer by a cutting force, and the bent elastic protrusions 11' and conductive protrusions pass through the elastic support layer to protrude from the rear surface of the elastic support layer, and come in contact with the rear surface of the elastic support layer.

Accordingly, electrons can be transferred from one side surface to the other side surface of the sheet through the conductive protrusions 21 of the conductive layer 2, the conductive protrusions 21 passing through the elastic support layer to be in contact with the rear surface of the elastic support layer. In addition, heat emitted from an electronic device can be transferred from one side surface to the other side surface of the sheet (for example, in an electronic device, from a surface in contact with a heating element to another surface in contact with the outside) through the conductive protrusions 21 at a high speed. Therefore, the electromagnetic wave shielding heat-radiation sheet according to the present invention has a high electromagnetic wave shielding/absorbing property and a high heat conductive property, and thus an electronic device including such an electromagnetic wave shielding heat-radiation sheet of the present invention can be protected from an electromagnetic wave and heat.

Also, contrary to a conventional heat radiating system or a conventional electromagnetic wave shielding/absorbing system, the electromagnetic wave shielding heat-radiation sheet according to the present invention can effectively protect an electronic device from external mechanical impact because the elastic support layer 1 does not contain heat-conductive filler or electric-conductive filler that reduces physical properties of the sheet. In addition, due to an elastic support layer, the electromagnetic wave shielding heat-radiation sheet according to the present invention can have high flexibility and high fillability, thereby improving close adhesion property with an electronic device having a non-uniform surface.

The elastic support layer 1 that may be used in the present invention is not particularly limited, as long as the elastic support layer includes a material having elastic force enough to absorb external mechanical impact. For example, the elastic support layer 1 may include natural rubber, synthetic rubber, such as neoprene, a thermoplastic resin, or a thermosetting resin, etc. Specifically, the elastic support layer 1 may include a material selected from the group including natural rubber, a polysilicon-based resin, a polyethylene-based resin, a polypropylene-based resin, a polyvinyl chloride-based resin, a polyvinylidene chloride-based resin, a polystyrene-based resin, a polyester-based resin, a polyacrylic resin, a styrene-butadiene copolymer, a styrene-acrylonitrile (SAN) copolymer, an ethylene-vinylalcohol copolymer (EVA resin), an acrylonitrile-butadiene-styrene (ABS) resin, a polyurethane-based resin, a fluoro resin, a polysilicon based-resin, and a mixture thereof. The above material is foamed as solid or sponge having a specific gravity of about 0.05 to 1.0 grs/cc as required, thereby providing a high impact absorbing property or close adhesion property with an electronic device. Due to the existence of such an elastic support layer, the electromagnetic wave shielding heat-radiation sheet according to the present invention can have a high mechanical impact absorbing property and close adhesion property with an electronic device.

The thickness of such an elastic support layer 1 is not particularly limited, but it is preferable to adjust the thickness of the elastic support layer according to a position to which a sheet is applied so that an electronic device or an electronic component can be protected from impact or vibration. For example, a relatively thick sheet is preferably used for a large electronic device, such as a notebook computer, and a relatively thin sheet is preferably used for a small electronic device, such as a cellular phone. According to an embodiment of the present invention, the thickness of the elastic support layer has a thickness of about 0.1 to 10 mm, and preferably of about 0.1 to 5 mm.

Also, in order to prevent the size and shape of the elastic support layer being changed, a reinforcement member may be laminated on the elastic support layer. Non-limiting examples of the reinforcement member include polyimide, polyethylene terephthalate (PET), polyetheretherketone (PEEK), etc. The thickness of the reinforcement member is adjusted according to the member's material or an electronic device to which a gasket is applied, and may be, but is not limited to, about 1 to 5 mil (cf. 1 mil=about 0.025 mm).

In the elastic support layer 1, i) perforated portions 11 may be formed at a predetermined interval by partially punching the elastic support layer; or else elastic protrusions 11' may be formed at a predetermined interval by partially cutting the elastic support layer, the elastic protrusions 11', being bent toward the rear surface of the elastic support layer by a cutting force to protrude from the rear surface of the elastic support layer, and coming in contact with the rear surface of the elastic support layer. Since such perforated portions 11 or elastic protrusions 11' are formed on the elastic support layer 1, the electromagnetic wave shielding heat-radiation sheet according to the present invention can be easily applied to an electronic device having a non-uniform surface, that is, a rough surface, and thus can have an improved close adhesion property with an electronic device. Especially, since the elastic protrusions 11' are similar to convex embossing shapes, the close adhesion property between the electromagnetic wave shielding heat-radiation sheet of the present invention and an electronic device may be more significantly improved. Also, through the perforated portions 11, the conductive protrusions 21 of the present invention can easily pass through the elastic support layer to come in contact with the rear surface of the elastic support layer.

Figure 4:
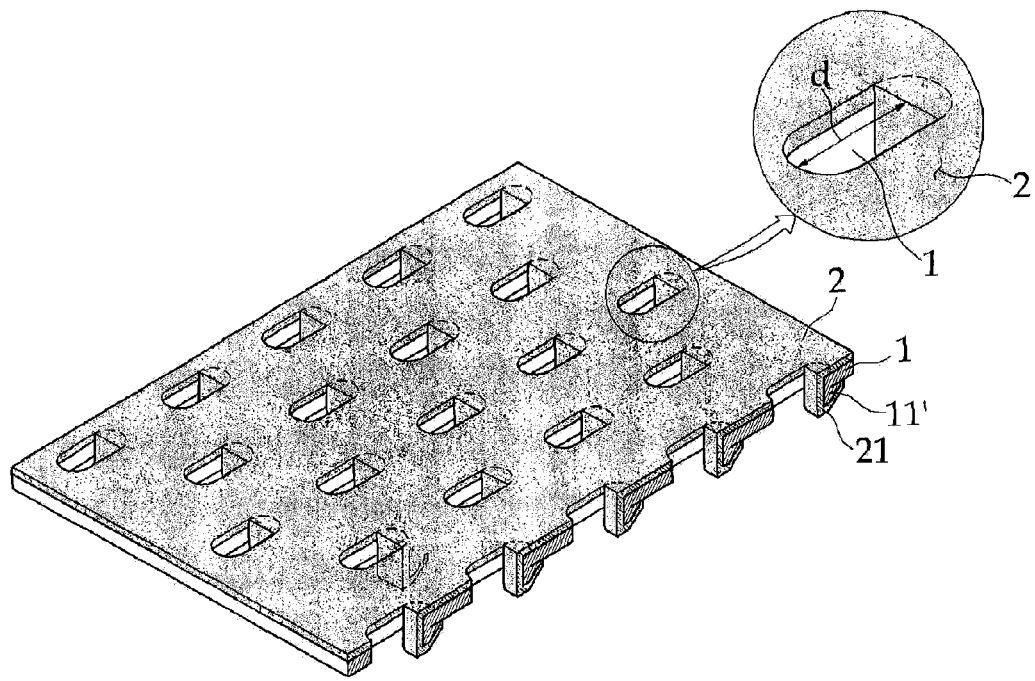
FIG. 4 is a perspective view of an electromagnetic wave shielding heat-radiation sheet according to another embodiment of the present invention, in which an enlarged view illustrates a conductive protrusion, together with an elastic protrusion of an elastic support layer, formed by partially cutting a conductive layer, the conductive protrusion together with the elastic protrusion being bent toward the rear surface of the elastic support layer to pass through the elastic support layer, and coming in contact with the rear surface of the elastic support layer.
Figure 5:
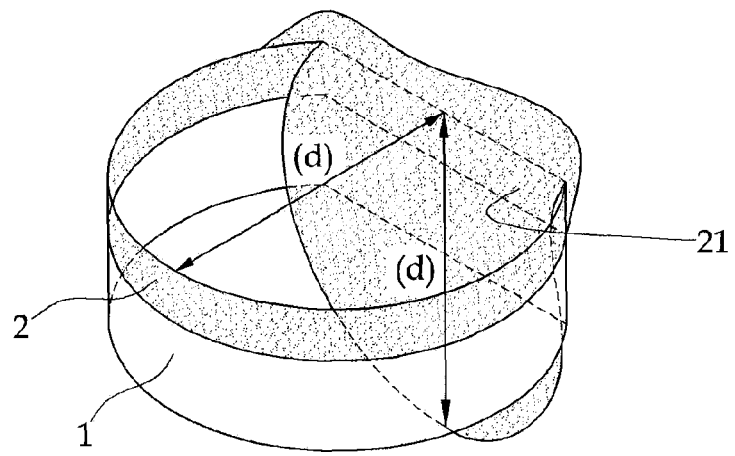
FIG. 5 is an enlarged view of a conductive protrusion and a perforated portion, which are formed on an electromagnetic wave shielding heat-radiation sheet according to an embodiment of the present invention.

Both the radius d of the perforated portions and the vertical length d of the elastic protrusions are not particularly limited, as long as the conductive protrusions 21 of the conductive layer protrude from the rear surface of the elastic support layer to come in contact with the rear surface of the elastic support layer as shown in FIGS. 2 and 4. For example, both the radius d of the perforated portions and the vertical length d of the elastic protrusions are preferably the same as or greater than the added thickness of the elastic support layer and the conductive layer. More preferably, both the radius d of the perforated portions and the vertical length d of the elastic protrusions are the same as or about two times greater than the added thickness of the elastic support layer and the conductive layer.

Also, the interval between the perforated portions and the interval between the elastic protrusions are not particularly limited, but are preferably adjusted according to an electronic device to which the electromagnetic wave shielding heat-radiation sheet of the present invention is applied. If the proportion of the perforated portions or the elastic protrusions in an electromagnetic wave shielding heat-radiation sheet applied to an electronic device is too high, the strength of the elastic support layer is reduced, and thus it may be difficult for the electromagnetic wave shielding heat-radiation sheet according to the present invention to sufficiently protect an electronic device from external mechanical impact. Accordingly, each of the perforated portions and the elastic protrusions may be preferably formed in the elastic support layer in a proportion of 1 to 100 per 1 cm$^2$. Also, an angle between each of serial perforated portions and the closed perforated portion disposed on an adjacent row, or an angle between each of serial elastic protrusions and the closed elastic protrusion disposed on an adjacent row may be preferably about 30 to 90°, or about 45 to 60° in certain circumstances (see FIG. 6).

On one surface or on each of both surfaces of such an elastic support layer 1, a conductive layer 2 that can shield/absorb an electromagnetic wave emitted from an electronic device and at the same time can radiate heat to the outside is laminated. Herein, the thickness of the conductive layer may be adjusted according to an electronic device to which the electromagnetic wave shielding heat-radiation sheet of the present invention is applied, and is preferably about 0.1 to 10 mil.

A material for the conductive layer 2 is not particularly limited, as long as the material can transfer electricity and heat. For example, the conductive layer 2 may include: a heat/electric conductive film; a heat/electric conductive fabric; and a heat/electric conductive non-woven fabric.

Examples of the heat/electric conductive film may include, but are not limited to, a thin sheet made from metal or metalloid (for example, aluminum foil), such as gold, platinum, silver, copper, nickel, tin, aluminum, a mixture thereof, etc.

Also, the heat/electric conductive fabric may be obtained by depositing, applying, electrolytic-plating, or electroless-plating a heat/electric conductive material, such as gold, platinum, silver, copper, nickel, tin, aluminum, graphite, or a mixture thereof, to a surface of a fabric; or may be obtained by using fibers to which the heat/electric conductive material is deposited, applied, electrolytic-plated, or electroless-plated. Also, any other fabrics having heat/electric conductivity through other methods besides the above described methods may be used for the conductive layer without particular limitations.

Also, the heat/electric conductive non-woven fabric may be obtained by depositing, applying, electrolytic-plating, or electroless-plating a heat/electric conductive material, such as gold, platinum, silver, copper, nickel, tin, aluminum, graphite, or a mixture thereof, to a surface of a non-woven fabric; or may be obtained by combining webs including fibers to which the heat/electric conductive material is deposited, applied, electrolytic-plated, or electroless-plated. Also, any other non-woven fabrics having heat/electric conductivity through other methods besides the above described methods may be used for the conductive layer without particular limitations.

According to such materials for the conductive layer, the electromagnetic wave shielding heat-radiation sheet of the present invention may have surface conductivity of about $10^{-6}$ to $10^4$ ohm·square, and thus can effectively shield or absorb an electromagnetic wave emitted from an electronic device. Also, the electromagnetic wave shielding heat-radiation sheet of the present invention has heat conductivity of about 30 to 300 W/mK, and thus can momentarily radiate heat emitted from the inside of an electronic device to the outside.

In such a conductive layer 2, conductive protrusions 21 are formed by partially cutting the conductive layer. The conductive protrusions 21 pass through the elastic support layer to protrude from the rear surface of the elastic support layer, and come in contact with the rear surface of the elastic support layer.

Figure 3:
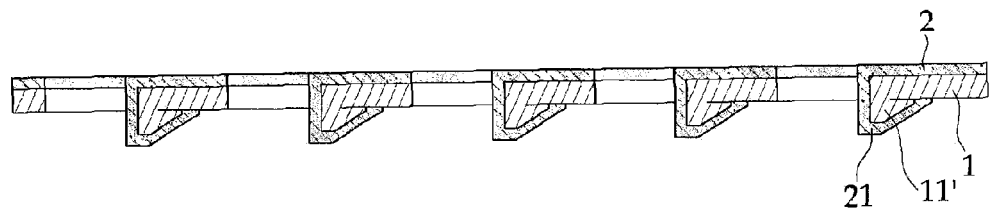
FIG. 3 is a cross-sectional view of an electromagnetic wave shielding heat-radiation sheet according to another embodiment of the present invention.

Specifically, i) as shown in FIGS. 1 and 2, the conductive protrusions 21 may be bent by a cutting force to pass through the elastic support layer via perforated portions 11 formed on the elastic support, and protrude from the rear surface of the elastic support layer to come in contact with the rear surface of the elastic support layer, or else, as shown in FIGS. 3 and 4, the conductive protrusions 21, together with elastic protrusions 11' formed on the elastic support layer, may be bent by a cutting force toward to the rear surface of the elastic support layer to pass through the elastic support layer, and protrude from the rear surface of the elastic support layer to come in contact with the rear surface of the elastic support layer.

Through the conductive protrusions 21 of the conductive layer 2, the conductive protrusions 21 passing through the elastic support layer and coming in contact with the rear surface of the elastic support layer, the electromagnetic wave shielding heat-radiation sheet of the present invention can easily transfer electricity and heat from one side surface to the other side surface. According to materials for the conductive layer, the electromagnetic wave shielding heat-radiation sheet of the present invention may have volume conductivity of about $10^{-6}$ to $10^4$ ohm·cm, and heat conductivity of about 30 to 300 W/mK.

Accordingly, contrary to a conventional electromagnetic wave shielding/absorbing system having only an electromagnetic wave shielding/absorbing property or a conventional heat radiating system having only heat conductivity, the electromagnetic wave shielding heat-radiation sheet according to the present invention can play both roles as an electromagnetic wave shielding/absorbing system and a heat radiating system.

Figure 6:
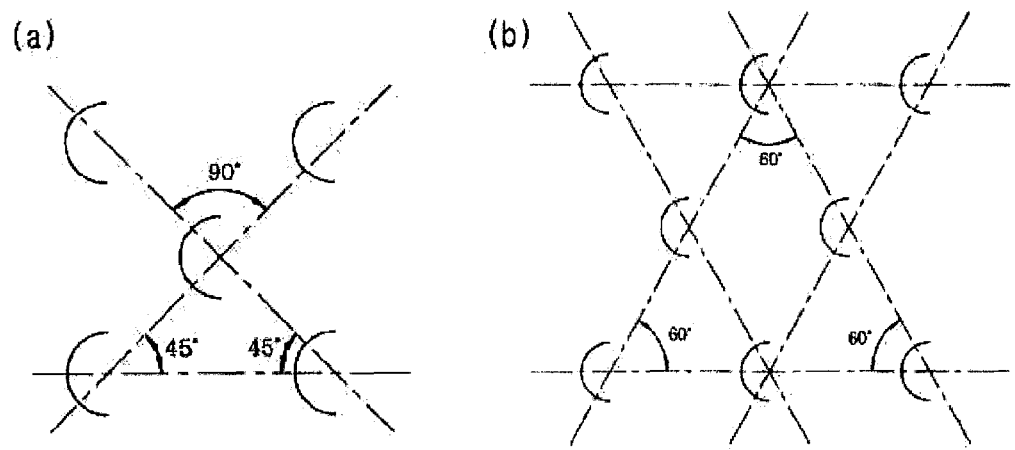
FIG. 6 illustrates angles ((a) 60°, (b) 45°) formed between each of a perforated portion, a conductive protrusion, and an elastic protrusion and a closed one disposed on an adjacent row.

However, in order to transfer electricity and heat from one side surface to the other side surface of the electromagnetic wave shielding heat-radiation sheet of the present invention through such conductive protrusions, the vertical length d of the conductive protrusions is preferably the same as or greater than the added thickness of the elastic support layer and the conductive layer, in the same manner of the radius of the perforated portions and the vertical length of the elastic protrusions (see FIG. 6). If the vertical length of the conductive protrusions is shorter than the added thickness of the elastic support layer and the conductive layer, the conductive protrusions cannot pass through the elastic support layer to protrude from the rear surface of the elastic support layer, and thus, cannot come in contact with the rear surface of the elastic support layer. Accordingly, since there is no contact portion transferring electricity and heat from one side surface to the other side surface of a sheet, it is difficult to transfer the electricity and heat from one side surface to the other side surface. Therefore, the vertical length d of the conductive protrusions is preferably the same as or greater than the added thickness of the elastic support layer and the conductive layer. More preferably, the vertical length d of the conductive protrusions is the same as or is about two times greater than the added thickness of the elastic support layer and the conductive layer.

Figure 7:
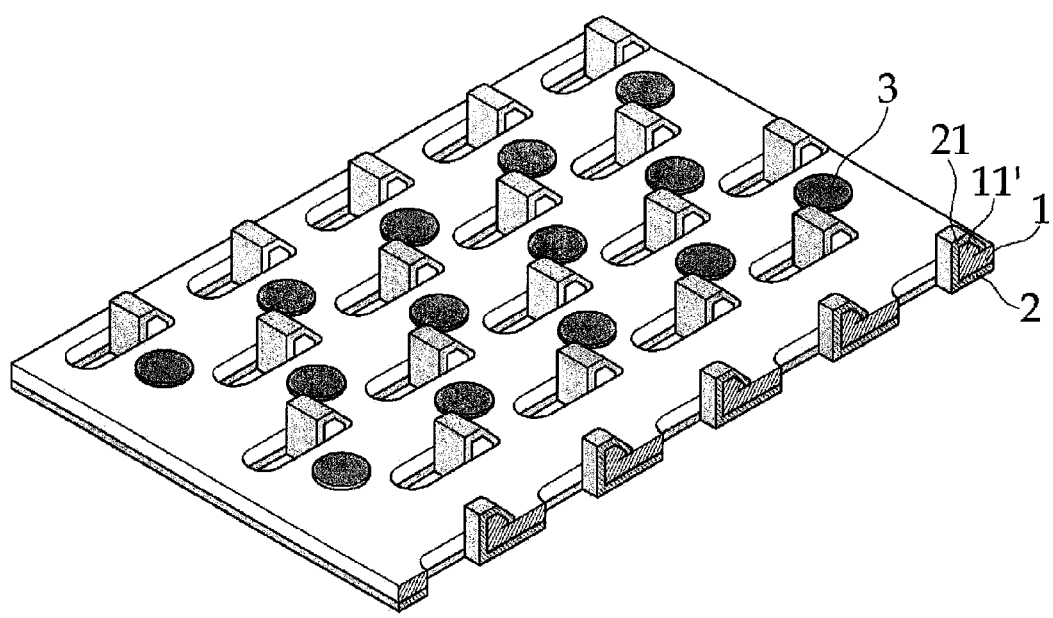
FIG. 7 is a bottom perspective view of an electromagnetic wave shielding heat-radiation sheet according to another embodiment of the present invention.

Meanwhile, the electromagnetic wave shielding heat-radiation sheet of the present invention may include an adhesive layer 3 partially or entirely formed on the rear surface of the elastic support layer (see FIG. 7). The adhesive layer allows the electromagnetic wave shielding heat-radiation sheet of the present invention to be adhered to an electronic device.

The adhesive layer 3 may include a first adhesive containing heat-conductive filler and/or electric-conductive filler; or a second adhesive not containing both the heat-conductive filler and the electric-conductive filler.

Specifically, an adhesive layer 3 formed on the whole of the rear surface of the elastic support layer is preferably formed by the first adhesive so that electricity and heat can be transferred from one side surface to the other side surface of a sheet.

Also, an adhesive layer 3 partially formed on the rear surface of the elastic support layer may be formed by at least one of the first adhesive and the second adhesive. For example, dot-shaped adhesive layers on spaces existing between perforated portions or elastic protrusions on the rear surface of the elastic support layer may be formed by the first adhesive or the second adhesive without particular limitations because electricity and heat can be transferred from one side surface to the other side surface of a sheet by the conductive protrusions of the conductive layer. However, the first adhesive contains heat-conductive filler and/or electric-conductive filler, such as nickel, silver, copper, etc., and thus the viscosity of the adhesive layer may be lower than the second adhesive. Also, the heat-conductive filler and/or electric-conductive filler may be oxidized by contacting oxygen, thereby lowering the heat conductivity and electric conductivity of the adhesive layer. Also, in general, since the first adhesive includes expensive heat-conductive filler and/or electric-conductive filler, the production cost thereof is high. Accordingly, if an adhesive layer is formed by such a first adhesive, the production cost of the electromagnetic wave shielding heat-radiation sheet according to the present invention may be increased. Therefore, it is preferable that the adhesive layer 3 partially formed on the rear surface of the elastic support layer is formed by the second adhesive.

The thickness of the adhesive layer is not particularly limited, but it is preferable to adjust the thickness according to a position to which an electromagnetic wave shielding heat-radiation sheet of the present invention is applied. However, if the thickness of the adhesive layer is too thin, the sheet cannot be desirably adhered to an electronic device, and it is thus preferable that an adhesive layer having an appropriate thickness is formed.

Meanwhile, the electromagnetic wave shielding heat-radiation sheet of the present invention may be manufactured by the following methods, but the present invention is not limited to these methods.

For example, the electromagnetic wave shielding heat-radiation sheet of the present invention may be manufactured by the steps of: (a) independently forming each of an elastic support layer and a conductive layer; (b) forming perforated portions in the elastic support layer by using a first punching machine; (c) laminating the conductive layer on at least one surface of the elastic support layer having the perforated portions formed therein; and (d) forming conductive protrusions in the conductive layer by partially cutting the conductive layer coaxial to the perforated portions by using a second punching machine. Herein, in step (d), the conductive protrusions are formed by cutting, while being bent toward the rear surface of the elastic support layer by a cutting force to pass through the elastic support layer via the perforated portions, and protruding from the rear surface of the elastic support layer to come in contact with the rear surface of the elastic support layer.

In step (a), the elastic support layer 1 may be manufactured by a method known in the art. For example, an elastic support layer including polyurethane may be manufactured by a method including the steps of: mechanically mixing a polyhydroxy compound, an organic polyisocyanate compound, a cross-linking agent, a catalyst, and a foam stabilizer in a high-speed mixer by using inert gas (such as nitrogen, helium, etc.) or air; and molding and cross-linking the mixture into a sheet shape on a conveyor belt.

Also, the conductive layer 2 may be manufactured by a method known in the art. For example, a conductive layer including aluminum foil may be manufactured by a method including the steps of: melting a raw material, aluminum ingot, in a melting furnace; and extruding the melted material into a desired shape.

Then, in step (b), perforated portions 11 may be formed in the prepared elastic support layer by using a first punching machine. Herein, the first punching machine is not particularly limited as long as the punching machine is a punching device conventionally known in the art, such as a device mounted with a punching portion. For example, the first punching machine may include a punching press, etc.

The diameter of a punching portion mounted in the first punching machine is preferably adjusted according to the radius d of perforated portions to be formed. In other words, the diameter of the punching portion mounted in the first punching machine is adjusted in such a manner that the radius d of formed perforated portions is the same as or greater than (for example, two times greater than) the added thickness of the elastic support layer and the conductive layer.

Also, the shape of the punching portion is not limited, no matter which shape is used, for example, a circle, a quadrangle, a triangle, etc., but it is preferable that the shape allows each of conductive protrusions to be formed later to easily protrude from the rear surface of an elastic support layer according to the thickness of a sheet.

In addition, in the case of an elastic support layer including a thermoplastic resin, when the punching portion of the first punching machine is preheated to a temperature where the thermoplastic resin is deformed, that is, about 100 to 200° C., it is possible to more easily form perforated portions in the elastic support layer.

Then, in step (c), on at least one surface of the elastic support layer 1 having the perforated portions formed therein, the conductive layer 2 prepared in step (a) is laminated. Herein, the method of laminating the conductive layer on the elastic support layer is not particularly limited. The method of laminating the conductive layer may include: a method of forming a primer layer on the elastic support layer by a polyurethane-based resin, a polyolefin chloride-based resin, a polyamide-based resin, or a polyacrylic resin, etc., and laminating a conductive layer; or a method of laminating an elastic support layer and a conductive layer by using a heat-pressing roller.

Next, in step (d), in the conductive layer 2 laminated on the elastic support layer 1 having the perforated portions 11 formed therein, the conductive protrusions 21 are formed by partially cutting the conductive layer coaxial to the perforated portions by the second punching machine. Herein, the conductive protrusions 21 are formed by cutting of the second punching machine, while being bent toward the rear surface of the elastic support layer by a cutting force to pass through the elastic support layer via the perforated portions, and protruding from the rear surface of the elastic support layer to come in contact with the rear surface of the elastic support layer. The conductive protrusions 21 formed as described above can transfer electricity and heat from one side surface to the other side surface of the electromagnetic wave shielding heat-radiation sheet of the present invention.

As the second punching machine, a punching machine mounted with a needle portion may be used, the needle portion allowing only a part to be cut and leaving another part uncut. The shape of a portion cut by the second punching machine may include, but is not particularly limited to, a hemisphere (ex. 'C'), a quadrangle of which one side is closed (ex. '⊂'), a triangle of which one side is closed (ex. '<'), etc. However, if a sheet is thick, it is preferable to punch a portion of the conductive layer in the shape of a hemisphere or a quadrangle of which one side is closed, etc. to form conductive protrusions so that the conductive protrusions can pass through the elastic support layer via the perforated portions to easily protrude from the rear surface of the elastic support layer.

Hereinafter, another example of a manufacturing method will be described.

The electromagnetic wave shielding heat-radiation sheet of the present invention may be manufactured by the steps of: (i) forming each of an elastic support layer and a conductive layer; (ii) laminating the conductive layer on at least one surface of the elastic support layer; and (iii) forming conductive protrusions in the conductive layer, and at the same time forming elastic protrusions in the elastic support layer by partially cutting both the elastic support layer and the conductive layer at a predetermined interval by using a punching machine. Herein, in step (iii), the conductive protrusions formed by cutting, together with the elastic protrusions, are bent toward the rear surface of the elastic support layer by a cutting force to pass through the elastic support layer, and protrude from the rear surface of the elastic support layer to come in contact with the rear surface of the elastic support layer.

In this method, the elastic support layer and the conductive layer are laminated without perforated portions in the prepared elastic support layer, unlike a previously described manufacturing method in which perforated portions are formed in an elastic support layer.

Then, in step (iii), the laminated sheet of the elastic support layer and the conductive layer are partially cut at a predetermined interval by using the punching machine to form the conductive protrusions 21 in the conductive layer, and at the same time to form the elastic protrusions 11' in the elastic support layer. As the punching machine, the same as the second punching machine as described above may be used.

In the case of an elastic support layer including a thermoplastic resin, when a punching machine is used to form the conductive protrusions 21 in the conductive layer, and at the same time to form the elastic protrusions 11' in the elastic support layer, preheating of a needle portion of the punching machine to thermal deformation temperature of the thermoplastic resin may make it easier to form the conductive protrusions and the elastic protrusions. Although the thermal deformation temperature of the thermoplastic resin varies according to the kind of used polymer, the temperature is generally in a range of about 100 to 200° C.

Meanwhile, the method of manufacturing the electromagnetic wave shielding heat-radiation sheet according to the present invention may further include the step of pressing conductive protrusions 21, or both conductive protrusions 21 and elastic protrusions 11' protruding from the rear surface of an elastic support layer to the rear surface the elastic support layer by using a pressing roller. Accordingly, it is possible to prevent the conductive protrusions protruding from the rear surface of the elastic support layer from being rolled toward the elastic support layer and not protruding from the rear surface of the elastic support layer.

Also, the method of manufacturing the electromagnetic wave shielding heat-radiation sheet according to the present invention may further include the step of forming an adhesive layer by partially or entirely applying an adhesive on the rear surface of the elastic support layer.

An adhesive that may be used in the present invention includes: a first adhesive containing heat-conductive filler and/or electric-conductive filler; or a second adhesive not containing both the heat-conductive filler and the electric-conductive filler. However, when the rear surface of an elastic support layer is entirely applied with an adhesive, the first adhesive is preferably used. Also, when the rear surface of an elastic support layer is partially applied with an adhesive, at least one of the first adhesive and the second adhesive may be used, but it is preferable to use the second adhesive rather than the first adhesive in consideration of a production cost, etc. to form an adhesive layer through adhesive application in a dot shape.

As described above, the electromagnetic wave shielding heat-radiation sheet according to the present invention can protect an electronic device from heat and an electromagnetic wave emitted from the inside, and also can protect an electronic device from external mechanical impact. Accordingly, the electromagnetic wave shielding heat-radiation sheet of the present invention may be applied to an electronic device such as a cellular phone, a personal mobile terminal, a notebook computer, etc. Herein, it is preferable to punch the electromagnetic wave shielding heat-radiation sheet of the present invention in an appropriate shape according to the shape of an electronic device or a component to which the sheet will be applied.

Industrial Applicability

In the electromagnetic wave shielding heat-radiation sheet according to the present invention, it is possible to transfer electricity and heat from one side surface to the other side surface of the sheet because conductive protrusions are bent toward the rear surface of an elastic support layer to pass through the elastic support layer, and come in contact with the rear surface of the elastic support layer, the conductive protrusions being formed by partially cutting a conductive layer laminated on the elastic support layer.

While this invention has been described in connection with what is presently considered to be the most practical and exemplary embodiment, it is to be understood that the invention is not limited to the disclosed embodiment and the drawings, but, on the contrary, it is intended to cover various modifications and variations within the spirit and scope of the appended claims.

The invention claimed is:

1. An electromagnetic wave shielding heat-radiation sheet comprising:
   an elastic support layer; and at least one conductive layer laminated on one surface or both surfaces of the elastic support layer,
   wherein, in the elastic support layer, multiple perforated portions are formed at a predetermined interval;
   in the conductive layer, conductive protrusions are formed by partially cutting the conductive layer, which are coaxial to the perforated portions; and
   the conductive protrusions are bent toward a rear surface of the elastic support layer to pass through the elastic support layer via the perforated portions, and protrude from the rear surface of the elastic support layer to come in contact with the rear surface of the elastic support layer.

2. The electromagnetic wave shielding heat-radiation sheet as claimed in claim 1, wherein both radius of the perforated portions and a vertical length of the conductive protrusions are same as or greater than an added thickness of the elastic support layer and the conductive layer.

3. The electromagnetic wave shielding heat-radiation sheet as claimed in claim 1, which comprises an adhesive layer partially or entirely formed on the rear surface of the elastic support layer.

4. The electromagnetic wave shielding heat-radiation sheet as claimed in claim 3, wherein the adhesive layer partially formed on the rear surface of the elastic support layer is formed between the perforated portions or the elastic protrusions in a dot shape.

5. The electromagnetic wave shielding heat-radiation sheet as claimed in claim 3, wherein the adhesive layer partially formed on the rear surface of the elastic support layer is formed between the perforated portions or the elastic protrusions in a dot shape.

6. An electromagnetic wave shielding heat-radiation sheet comprising:
   an elastic support layer; and at least one conductive layer laminated on one surface or both surfaces of the elastic support layer,
   wherein, in the elastic support layer, multiple elastic protrusions are formed by partially cutting the elastic support layer at a predetermined interval;
   the elastic protrusions are bent toward a rear surface of the elastic support layer to come in contact with the rear surface of the elastic support layer;
   in the conductive layer, conductive protrusions are formed by partially cutting the conductive layer, which are coaxial to the elastic protrusions; and
   the conductive protrusions are bent, together with the elastic protrusions, toward the rear surface of the elastic support layer to pass through the elastic support layer, and protrude from the rear surface of the elastic support layer to come in contact with the rear surface of the elastic support layer.

7. The electromagnetic wave shielding heat-radiation sheet as claimed in claim 6, wherein both a vertical length of the elastic protrusions and a vertical length of the conductive protrusions are same as or greater than an added thickness of the elastic support layer and the conductive layer.

8. The electromagnetic wave shielding heat-radiation sheet as claimed in claim 6, which comprises an adhesive layer partially or entirely formed on the rear surface of the elastic support layer.

9. A method of manufacturing an electromagnetic wave shielding heat-radiation sheet, the method comprising the steps of:
   (a) forming each of an elastic support layer and a conductive layer;
   (b) forming perforated portions in the elastic support layer by using a first punching machine;
   (c) laminating the conductive layer on at least one surface of the elastic support layer having the perforated portions formed therein; and
   (d) forming conductive protrusions in the conductive layer at a predetermined interval by partially cutting the conductive layer coaxial to the perforated portions by using a second punching machine,
   wherein, in step (d), the conductive protrusions are formed by cutting, while being bent toward a rear surface of the elastic support layer by a cutting force to pass through the elastic support layer via the perforated portions, and protruding from the rear surface of the elastic support layer to come in contact with the rear surface of the elastic support layer.

10. The method as claimed in claim 9, wherein radius of the perforated portions formed in step (b) is same as or greater than an added thickness of the elastic support layer and the conductive layer.

11. The method as claimed in claim 9, wherein the first punching machine is preheated to thermal deformation temperature of a thermoplastic resin.

12. The method as claimed in claim 9, wherein step (d) is performed in such a manner that a vertical length of the conductive protrusions is same as or greater than an added thickness of the elastic support layer and the conductive layer.

13. The method as claimed in claim 9, which comprises the step of pressing the conductive protrusions protruding from the rear surface of the elastic support layer to the rear surface of the elastic support layer by using a pressing roller.

14. The method as claimed in claim 9, which further comprises the step of forming an adhesive layer by partially or entirely applying an adhesive on the rear surface of the elastic support layer.

15. A method of manufacturing an electromagnetic wave shielding heat-radiation sheet, the method comprising the steps of:
   (i) forming each of an elastic support layer and a conductive layer;
   (ii) laminating the conductive layer on at least one surface of the elastic support layer; and
   (iii) forming conductive protrusions in the conductive layer, and at the same time forming elastic protrusions in the elastic support layer by partially cutting the elastic support layer and the conductive layer at a predetermined interval by using a punching machine,
   wherein, in step (iii), the conductive protrusions are formed by cutting, while being bent, together with the elastic protrusions, toward a rear surface of the elastic support layer by a cutting force to pass through the elastic support layer, and protruding from the rear surface of the elastic support layer to come in contact with the rear surface of the elastic support layer.

16. The method as claimed in claim 15, wherein step (iii) is performed in such a manner that both a vertical length of the conductive protrusions and a vertical length of the elastic protrusions are same as or greater than an added thickness of the elastic support layer and the conductive layer.

17. The method as claimed in claim 15, wherein the punching machine is preheated to thermal deformation temperature of a thermoplastic resin.

18. The method as claimed in claim 15, which comprises the step of pressing the conductive protrusions and the elastic protrusions protruding from the rear surface of the elastic support layer to the rear surface of the elastic support layer by using a pressing roller.

19. The method as claimed in claim 15, which further comprises the step of forming an adhesive layer by partially or entirely applying an adhesive on the rear surface of the elastic support layer.

* * * * *